(12) United States Patent
Liang et al.

(10) Patent No.: US 11,695,426 B1
(45) Date of Patent: Jul. 4, 2023

(54) SAR ADC AND RELATED METHOD

(71) Applicant: xMEMS Labs, Inc., Santa Clara, CA (US)

(72) Inventors: Jemm Yue Liang, Sunnyvale, CA (US); Hsi-Sheng Chen, Fremont, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/171,687

(22) Filed: Feb. 21, 2023

Related U.S. Application Data (60) Provisional application No. 63/339,394, filed on May 6, 2022, provisional application No. 63/325,615, filed on Mar. 31, 2022.

(51) Int. Cl.
*H03M 1/38* (2006.01)

(52) U.S. Cl.
CPC ..................... *H03M 1/38* (2013.01)

(58) Field of Classification Search
CPC .................. H03M 1/38; H03M 1/12
USPC ......................... 341/155, 156, 161
See application file for complete search history.

(56) References Cited

U.S. PATENT DOCUMENTS

| | | | | |
|---|---|---|---|---|
| 7,952,509 B2 * | 5/2011 | Aruga | ................. | H03M 1/1215 341/163 |
| 2002/0122504 A1 * | 9/2002 | Payne | .................. | H04L 25/061 375/317 |

* cited by examiner

*Primary Examiner* — Peguy Jean Pierre
(74) *Attorney, Agent, or Firm* — Winston Hsu (57) ABSTRACT

A successive approximation register (SAR) analog-to-digital converter (ADC) includes a comparator, a threshold generator and a controller. The comparator receives an analog signal and the SAR ADC outputs an output codeword. The comparator performs a plurality of first comparisons and a plurality of second comparisons. The controller determines a plurality of most significant bits of the output codeword according to a plurality of first comparison results corresponding to the first comparisons. The first comparisons are performed by comparing the analog signal with a plurality of first thresholds. The controller determines a plurality of least significant bits of the output codeword according to a plurality of second comparison results corresponding to the second comparisons. The second comparisons are performed by comparing the analog signal with a second threshold. The controller controls the threshold generator to produce the plurality of first thresholds and the second threshold according to the first comparison results.

20 Claims, 11 Drawing Sheets

| Q = 4 | |
|---|---|
| $V_f/\sigma_T$ | $\langle Y_4 \rangle$ |
| $-\infty$ | 0 |
| -0.67448975 | 1 |
| 0 | 2 |
| 0.67448975 | 3 |
| $\infty$ | 4 |

(a)

| Q = 7 | |
|---|---|
| $V_f/\sigma_T$ | $\langle Y_7 \rangle$ |
| $-\infty$ | 0 |
| -1.06757052 | 1 |
| -0.56594882 | 2 |
| -0.18001237 | 3 |
| 0.18001237 | 4 |
| 0.56594882 | 5 |
| 1.06757052 | 6 |
| $\infty$ | 7 |

(b)

| Q = 8 | |
|---|---|
| $V_f/\sigma_T$ | $\langle Y_8 \rangle$ |
| $-\infty$ | 0 |
| -1.15034938 | 1 |
| -0.67448975 | 2 |
| -0.31863936 | 3 |
| 0 | 4 |
| 0.31863936 | 5 |
| 0.67448975 | 6 |
| 1.15034938 | 7 |
| $\infty$ | 8 |

| Q = 4 | |
|---|---|
| y | Estimate 4-bit $V_f$ |
| 0 | -15/16 |
| 1 | -9/16 |
| 2 | 0 |
| 3 | 9/16 |
| 4 | 15/16 |

(a)

| Q = 7 | |
|---|---|
| y | Estimate 4-bit $V_f$ |
| 0 | -15/16 |
| 1 | -9/16 |
| 2 | -5/16 |
| 3 | -1/16 |
| 4 | 1/16 |
| 5 | 5/16 |
| 6 | 9/16 |
| 7 | 15/16 |

(b)

| Q = 8 | |
|---|---|
| y | Estimate 5-bit $V_f$ |
| 0 | -31/32 |
| 1 | -29/32 |
| 2 | -17/32 |
| 3 | -8/32 |
| 4 | 0 |
| 5 | 8/32 |
| 6 | 17/32 |
| 7 | 29/32 |
| 8 | 31/32 |

SAR ADC AND RELATED METHOD

CROSS REFERENCE TO RELATED APPLICATIONS

This application claims the benefit of U.S. Provisional Application No. 63/325,615, filed on Mar. 31, 2022. Further, this application claims the benefit of U.S. Provisional Application No. 63/339,394, filed on May 6, 2022. The contents of these applications are incorporated herein by reference.

BACKGROUND OF THE INVENTION

1. Field of the Invention

The present invention relates to a successive approximation register (SAR) analog-to-digital converter (ADC), and more particularly, to a SAR ADC with an improved signal to quantization noise ratio (SQNR).

2. Description of the Prior Art

A conventional successive approximation register (SAR) analog-to-digital converter (ADC) performs analog-to-digital conversion through a method known as successive approximation registers. The conversion process derives bits of the digital output codeword successively, from the most significant bit (MSB) to the least significant bit (LSB), according to the results of comparisons of sampled values of an analog input signal with threshold voltages set according to the values in a register.

SUMMARY OF THE INVENTION

An objective of the present invention is to provide a successive approximation register (SAR) analog-to-digital converter (ADC) with an improved signal to quantization noise ratio (SQNR) by including fractional bits based on the comparison results of the original least significant bit (LSB).

An embodiment of the present invention discloses a SAR ADC, which comprises a comparator, a threshold generator and a controller. The comparator receives an analog signal and the SAR ADC outputs an output codeword. The comparator performs a plurality of first comparisons and a plurality of second comparisons. The controller determines a plurality of most significant bits of the output codeword according to a plurality of first comparison results corresponding to the plurality of first comparisons. The plurality of first comparisons are performed by comparing the analog signal with a plurality of first thresholds. The controller determines a plurality of least significant bits of the output codeword according to a plurality of second comparison results corresponding to the plurality of second comparisons. The plurality of second comparisons are performed by comparing the analog signal with a second threshold. The controller controls the threshold generator to produce the plurality of first thresholds and the second threshold according to the plurality of first comparison results.

Another embodiment of the present invention discloses a method applied in a SAR ADC, which is configured to output an output codeword. The method comprises steps of: receiving an analog signal; performing a plurality of first comparisons on the analog signal with a plurality of first thresholds; determining a plurality of most significant bits of the output codeword according to a plurality of first comparison results corresponding to the plurality of first comparisons; performing a plurality of second comparisons on the analog signal with a second threshold; determining a plurality of least significant bits of the output codeword according to a plurality of second comparison results corresponding to the plurality of second comparisons; and determining the plurality of first thresholds and the second threshold according to the plurality of first comparison results.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
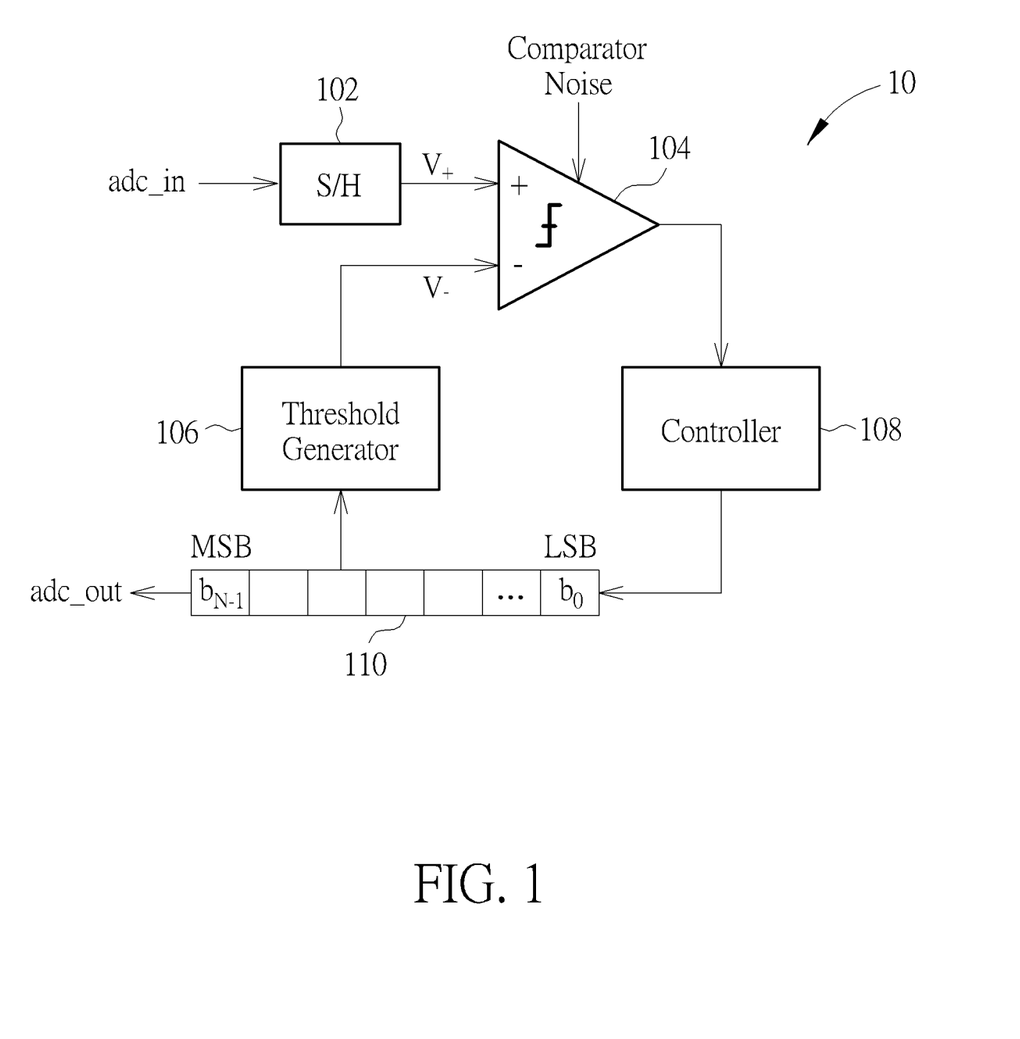
FIG. 1 is a schematic diagram of an N-bit SAR ADC.

FIG. 1 is a schematic diagram of an N-bit successive approximation register (SAR) analog-to-digital converter (ADC) 10, which is configured to output an N-bit output codeword adc_out by receiving an analog signal adc_in. The SAR ADC 10 includes a sample-and-hold (S/H) circuit 102, a comparator 104, a threshold generator 106, a controller 108 and a register 110. To generate the output codeword adc_out, the comparator 104 may compare the sampled analog signal adc_in (i.e., sampled by the S/H circuit 102) with a given threshold (i.e., generated by the threshold generator 106), to determine the values of the bit sequence $b_{N-1}$-$b_0$. The controller 108 may generate the values of the bit sequence $b_{N-1}$-$b_0$ according to the comparison results, to sequentially write the bit values into the register 110 from the most significant bit (MSB) $b_{N-1}$ to the least significant bit $b_0$, and correspondingly control the threshold generator 106 to generate appropriate threshold values for subsequent comparisons.

One parameter to measure the performance of a SAR ADC is signal to quantization noise ratio (SQNR). In theory, the SQNR of the SAR ADC 10 is decided by the allowable level of the analog signal adc_in and the number of bits in the output codeword adc_out. In practical designs of a general SAR ADC such as the SAR ADC 10, the SQNR is further reduced under the noise occurring at the comparator 104. In order to satisfy the design requirements of the SAR ADC 10, the comparator 104 may be requested to use high-speed and low-power design, which is usually accompanied by a non-ignorable comparator noise.

During the conversion process of the SAR ADC 10, in the direction from the MSB to the LSB, each bit $b_{N-1}$-$b_0$ of the output codeword adc_out is determined by the result of one comparison between two input voltages of the comparator 104, denoted as $V_+$ and $V_-$, respectively. Given the random nature of the noise at the comparator 104, there is a likelihood that the magnitude of the noise exceeds a certain level to cause a false determination of this specific bit, resulting in a quantization error greater than in the case of the noise-free condition, as such, in conventional SAR ADC, a multi-iteration-compare may be performed for b0 to reduce the chance for such quantization error. In the present invention, the random nature of the noise and the multi-iteration-compare operation is combined to achieve a resolution which corresponds to a fraction of the b0.

The operations of the SAR ADC 10 typically proceed bit by bit until the LSB is derived. The SAR ADC 10 then marks at this point the end of one analog-to-digital conversion without looking back to correct erroneous bits.

Note that the comparison for the LSB $b_0$ of the output codeword adc_out is most likely to be affected by the noise of the comparator; hence, when the comparator noise is close to or larger than the signal level corresponding to b0, some designers of the SAR ADC 10 have attempted to improve the SQNR by employing multiple comparisons to derive the LSB $b_0$ through a majority vote among the results of multiple comparisons. Referring to FIG. 1, after N–1 bits of the output codeword adc_out, i.e., $b_{N-1}$, ..., $b_1$, have been determined, the conversion process enters the last stage to determine the LSB $b_0$. Instead of one single comparison of the input voltages $V_+$ (i.e., the sampled input analog signal adc_in) and $V_-$ (i.e., a threshold voltage generated by the threshold generator 106) in conventional SAR ADC, the modified approach repeats the comparisons by multiple times, and then uses a majority-rule to determine the LSB. As an example, the process repeats the comparison by 8 times. If an event of $V_+>V_-$ occurs 5 times or more among the 8 comparisons, then $b_0=1$. On the other hand, if an event of $V_+>V_-$ occurs 4 times or less among the 8 comparisons, then $b_0=0$.

The SAR ADC 10 with multiple comparisons for the LSB $b_0$ does offer improvement on the SQNR. In the SAR ADC 10, the nature of the noise at the comparator 104 is a random process. To a good approximation, the sampled values of noise at different time instants are considered as independently and identically distributed random variables. Performing comparisons by multiple times and making decisions based on the majority-rule are equivalent to reducing the impact of noise and thus increasing the SQNR. However, the majority-rule only made uses of the most basic statistical properties of the noise and the improvement on SQNR is sub-optimal.

The present invention provides a novel SAR ADC, which provides improvements over the existing SAR ADC by making more comparisons and applying statistical properties of the noise occurring during the comparisons in a more comprehensive manner than majority-rule, so that the SQNR and the effective number of bits (ENOB) of the SAR ADC may be improved over those of the conventional SAR ADC.

Figure 2:
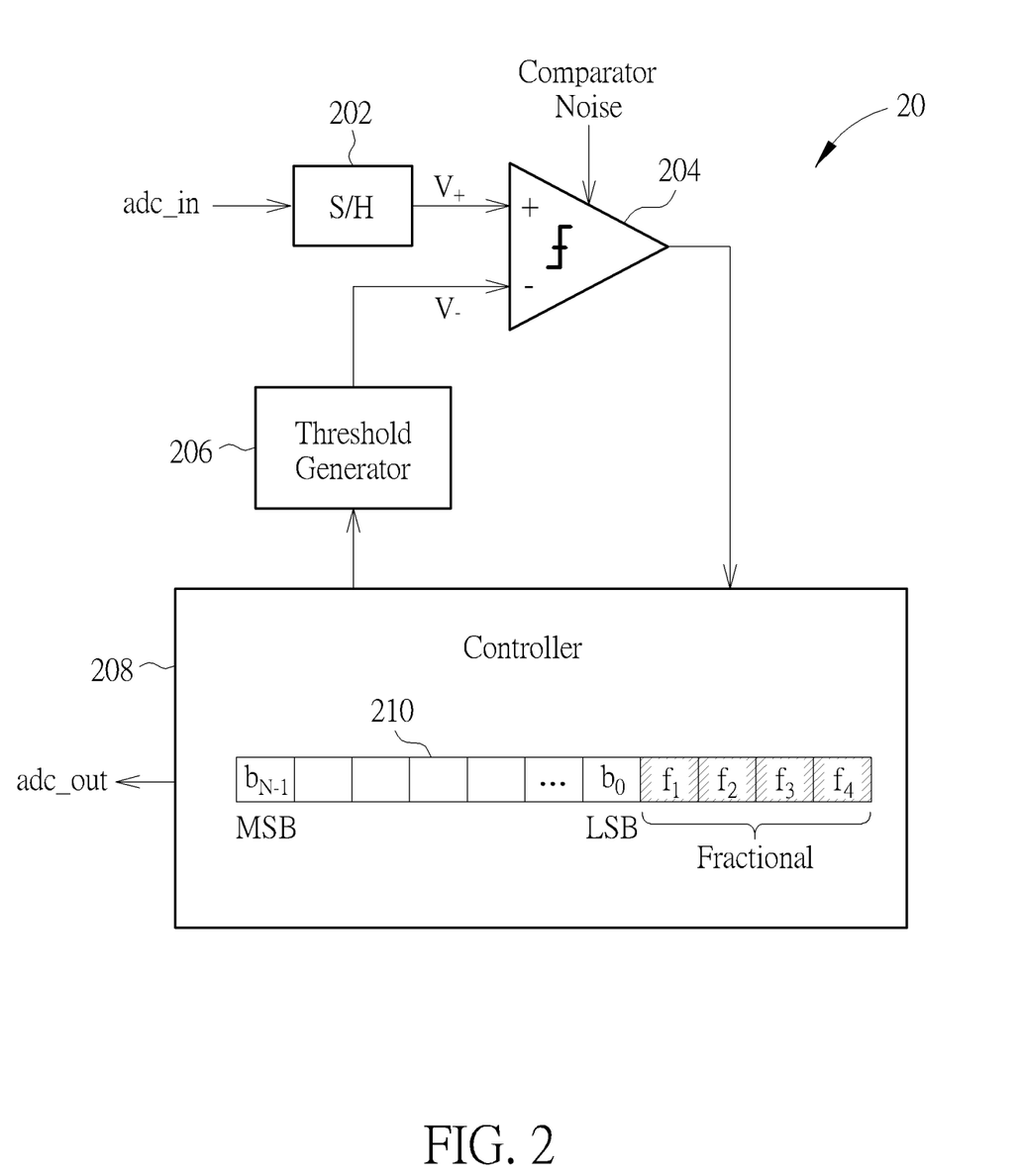
FIG. 2 is a schematic diagram of a SAR ADC according to an embodiment of the present invention.

FIG. 2 is a schematic diagram of a SAR ADC 20 according to an embodiment of the present invention. The SAR ADC 20 includes an S/H circuit 202, a comparator 204, a threshold generator 206 and a controller 208. The operations of the SAR ADC 20 are similar to the operations of the SAR ADC 10, so signals and elements having similar functions are denoted by the same symbols. The operations of the S/H circuit 202, the comparator 204 and the threshold generator 206 are similar to those of the S/H circuit 102, the comparator 104 and the threshold generator 106 as shown in FIG. 1. The difference between the SAR ADC 20 and the SAR ADC 10 is that, the controller 208 of the SAR ADC 20 includes a register 210, which is used to record the values of integer bits $b_{N-1}$-$b_1$ which are obtained from the comparisons with the corresponding threshold voltages, and also record the values of the LSB $b_0$ and several fractional bits $f_1$-$f_4$ which are obtained from the comparisons with the threshold voltage for the LSB $b_0$.

Figure 3:
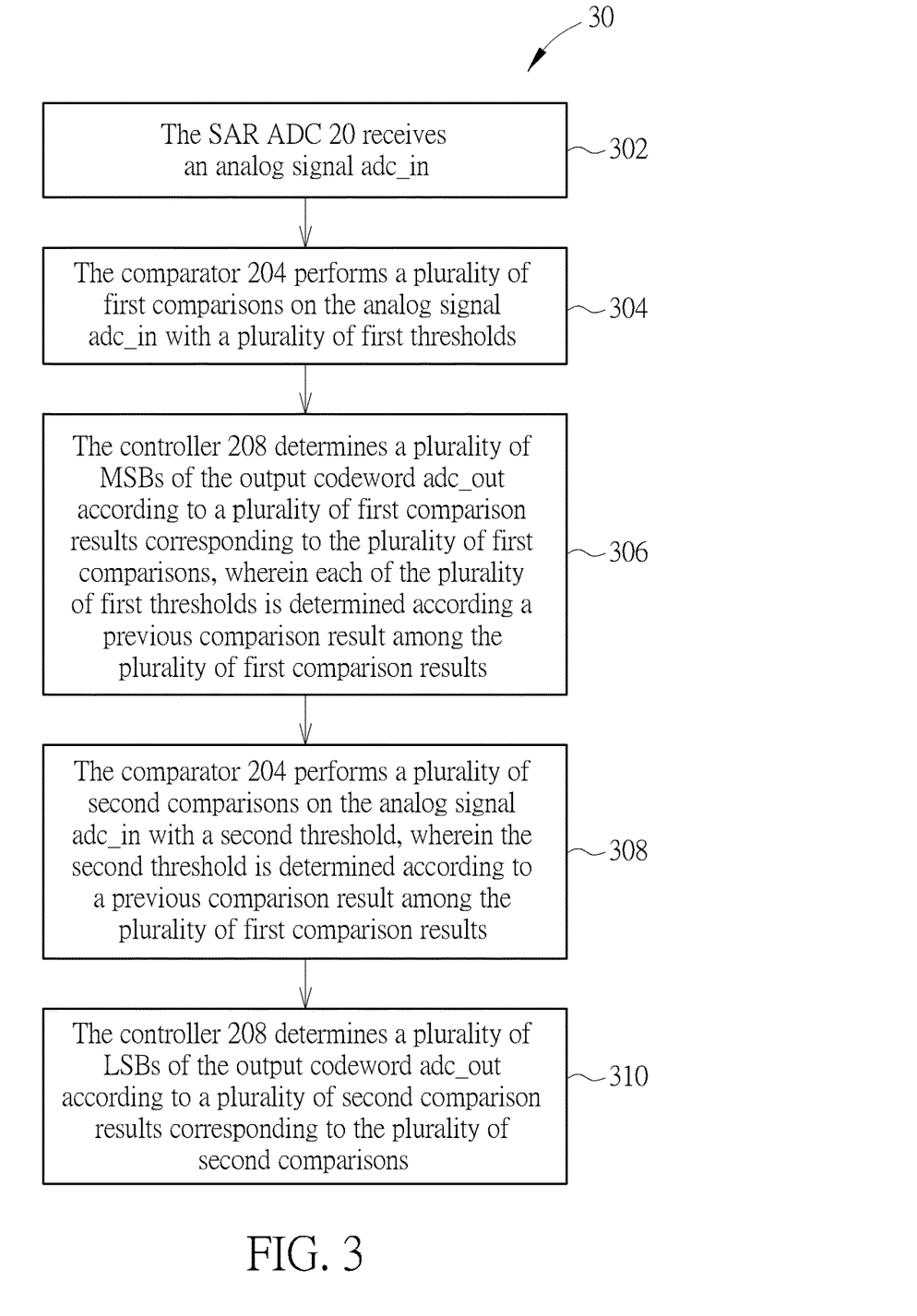
FIG. 3 is a flowchart of a process according to an embodiment of the present invention.

FIG. 3 is a flowchart of a process 30 according to an embodiment of the present invention. The process 30 may be implemented in a SAR ADC such as the SAR ADC 20 shown in FIG. 2. As shown in FIG. 3, the process 30 includes the following steps:

Step 302: The SAR ADC 20 receives an analog signal adc_in.

Step 304: The comparator 204 performs a plurality of first comparisons on the analog signal adc_in with a plurality of first thresholds.

Step 306: The controller 208 determines a plurality of MSBs of the output codeword adc_out according to a plurality of first comparison results corresponding to the plurality of first comparisons, wherein each of the plurality of first thresholds is determined according a previous comparison result among the plurality of first comparison results.

Step 308: The comparator 204 performs a plurality of second comparisons on the analog signal adc_in with a second threshold, wherein the second threshold is determined according to a previous comparison result among the plurality of first comparison results.

Step 310: The controller 208 determines a plurality of LSBs of the output codeword adc_out according to a plurality of second comparison results corresponding to the plurality of second comparisons.

Referring to FIG. 3 along with FIG. 2, the controller 208 may arrange the operations of the comparator 204 and control the threshold generator 206 to generate the necessary threshold voltages (i.e., the values of $V_-$) for comparisons, allowing the comparator 204 to perform comparisons to generate the comparison results. The controller 208 may further record the bit values in the register 210 as the bit sequence of the output codeword adc_out. In detail, the comparator 204 may perform a plurality of first comparisons with respective first thresholds for generating the first comparison results, and the controller 208 may determine the integer bits $b_{N-1}$-$b_1$ according to the first comparison results. The first threshold for the MSB $b_{N-1}$ may have a predetermined level, the comparison result of the MSB $b_{N-1}$ may be applied to determine the first threshold for the second MSB $b_{N-2}$, the comparison result of the second MSB $b_{N-2}$ may be applied to determine the first threshold for the third MSB $b_{N-3}$, and so on. Therefore, each of the first thresholds except for the first threshold for the MSB $b_{N-1}$ may be determined according to the previous first comparison result.

Subsequently, the comparator 204 may perform a plurality of second comparisons with a second threshold. The second comparisons are used for determining the values of the LSB $b_0$ and the fractional bits $f_1$-$f_4$, and the combinations of the LSB $b_0$ and the fractional bits $f_1$-$f_4$ are considered as the plurality of LSBs in the process 30. In this step, the second threshold may be determined according to the previous first comparison result for the bit $b_1$.

Therefore, at the end of the sequence of comparison operations, the controller 208 may deduce the output codeword adc_out that includes N integer bits $b_{N-1}$-$b_0$ and M fractional bits $f_1$-$f_M$, where M and N are positive integers. In the embodiment shown in FIG. 2, there are 4 fractional bits $f_1$-$f_4$.

Different from the abovementioned majority-rule where the redundant comparisons are only applied to determine the value of the LSB $b_0$, in the SAR ADC 20 of the present invention, the information of multiple comparisons for the LSB $b_0$, such as the statistical characteristics, is brought out in the LSB $b_0$ and also the fractional bits $f_1$-$f_4$. Therefore, the comparison results may be reflected by the values of the LSB $b_0$ and the fractional bits $f_1$-$f_4$. In such a situation, the statistical characteristics of the multiple comparison results may be applied to increase the resolution of the SAR ADC 20 by including these fractional bits $f_1$-$f_4$.

Figure 4:
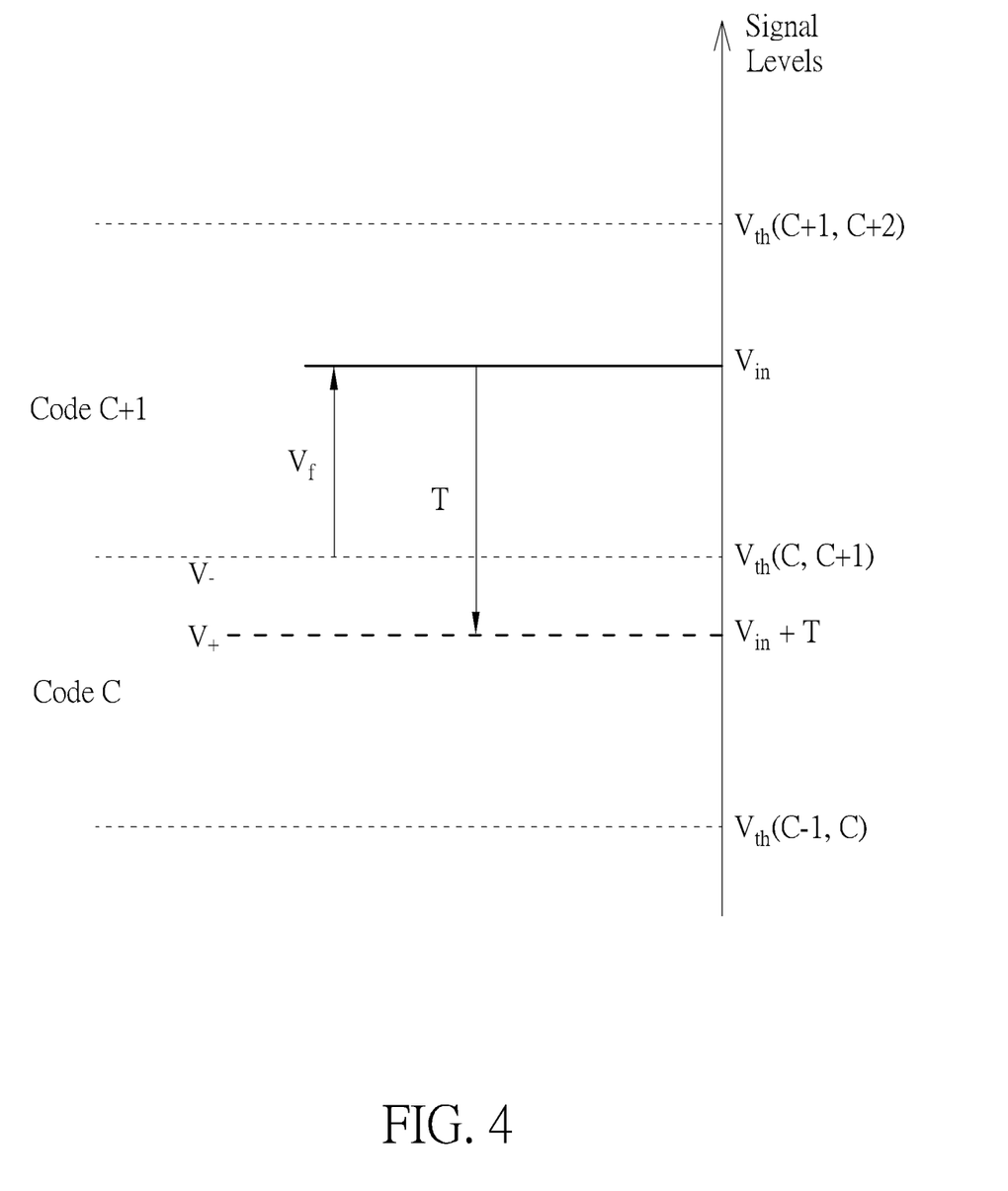
FIG. 4 depicts a scenario of comparator operations.

FIG. 4 depicts a scenario of comparator operations. The vertical direction indicates levels of various signals that are involved in the comparison process. The voltage $V_{in}$ is an input analog signal to be tracked and held for comparison. Correspondingly, a threshold voltage $V_{th}(C, C+1)$ is set that marks the threshold between the output code C and the output code C+1. For completeness, adjacent threshold voltages $V_{th}(C-1, C)$ and $V_{th}(C+1, C+2)$ are also shown in FIG. 4. In FIG. 4, it is supposed that the bit values from $b_{N-1}$ to $b_1$ have been generated and the comparator 204 is performing comparison to determine the value of the LSB $b_0$ based on the threshold voltage $V_{th}(C, C+1)$. The analog signal $V_{in}$ before being contaminated by the noise is a voltage $V_f$ away from the threshold voltage $V_{th}(C, C+1)$. When the comparator 204 starts to perform a comparison, a noise in the amount of T occurs at this time. In the following analysis, we add the effect of noise to the analog signal $V_{in}$ present at the positive input terminal of the comparator 204. The positive input voltage $V_+$ thus becomes $V_{in}+T$ as indicated in the dashed line. The analysis will lead to the same conclusion if the effect of noise is accounted for at the negative input terminal of the comparator 204.

Figure 5:
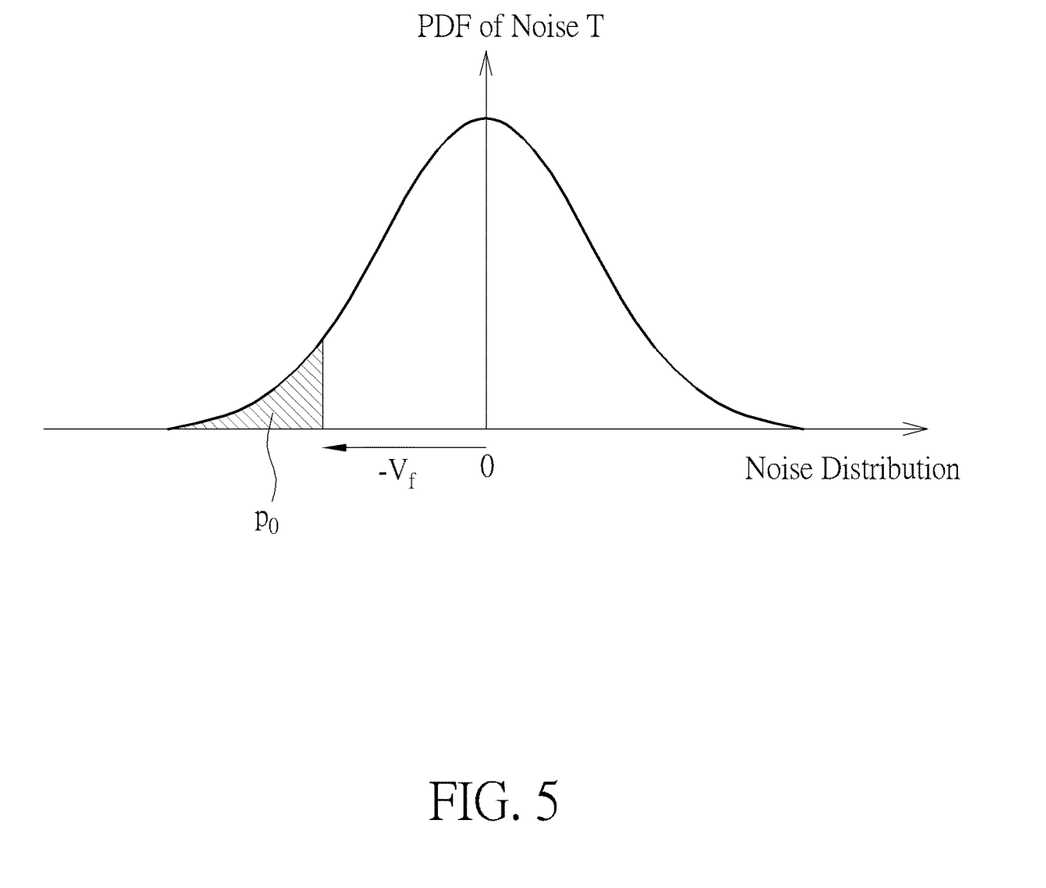
FIG. 5 illustrates the curve of the PDF of the random noise.

Referring to FIG. 4 along with FIG. 2, the comparator 204 in the SAR ADC 20 will produce a result corresponding to $V_+ > V_-$ or, equivalently, $V_{in}+T > V_{th}(C, C+1)$ if and only if $V_{th}(C, C+1)+V_f+T > V_{th}(C, C+1)$, or $T > -V_f$. In the following description, $p_1$ denotes the probability that the comparison result is 1 which indicates $V_+ > V_-$, while $p_0(=1-p_1)$ denotes the probability that the comparison result is 0 which indicates $V_+ \leq V_-$. As illustrated in FIG. 5, if the curve represents the probability density function (PDF) of the random noise T, then the area of the shaded region under the PDF curve is equal to $p_0$. This shaded area indicates the equation $T < -V_f$. Equivalently, a binary random variable X may be employed to describe the statistical behavior of the comparator 204:

$$X = \begin{cases} 0 & \text{if comparison result indicates } V_+ \leq V_- \\ 1 & \text{if comparison result indicates } V_+ > V_- \end{cases}; \quad \text{(Eq. 1)}$$

and $p_0 = P(X=0)$; $p_1 = P(X=1)$.

In many real systems, the noise T may be characterized as a zero-mean normally distributed (Gaussian) random process (as the PDF shown in FIG. 5) with a standard deviation $\sigma_T$, i.e., T: $N(0, \sigma_T)$. By employing this model to the noise T occurring at the comparator 204 in the SAR ADC 20, we can derive $$p_1 = \frac{1}{2}\text{erfc}\left(-\frac{v_f}{\sqrt{2}\,\sigma_T}\right); \quad \text{(Eq. 2)}$$

where erfc( ) is the complementary error function. This expression shows that $p_1$ is a function of $-V_f/(\sqrt{2}\sigma_T)$; for a given $\sigma_T$ obtained from measurement and characterization of the comparator 204, the probability $p_1$ and the voltage $V_f$ have a one-to-one correspondence.

Due to the one-to-one correspondence of the probability $p_1$ and the voltage $V_f$ (which is the difference between the input analog signal $V_{in}$ and the corresponding threshold voltage $V_{th}(C, C+1)$), the probability $p_1$ may be used to estimate the voltage $V_f$, and the voltage $V_f$ may further be applied to find the analog signal $V_{in}$.

Since the probability $p_1$ is a value smaller than 1, it is preferable to perform the comparison by multiple times to find the expected value with respect to the comparison results, such as the multiple second comparisons of the process 30 used for determining the values of the LSB $b_0$ and the fractional bits $f_1$-$f_4$. When the comparator 204 repeats the comparison Q times consecutively with the analog signal $V_{in}$ and the threshold voltage held unchanged (e.g., equal to $V_{th}(C, C+1)$), the outcome of these consecutive Q comparisons may be modeled by a random process:

$$Y_Q = X_1 + X_2 + \ldots + X_Q; \quad \text{(Eq. 3)}$$

where $X_m$ is a binary random variable as given in Eq. 1 for $m=1, 2, \ldots, Q$, and $Y_Q$ may be interpreted as the number of times the comparator 204 reports a comparison result of $V_+ > V_-$ among the Q comparisons. By combining Eq. 1, 2 and 3, we may obtain the expected value of $Y_Q$, denoted by $\langle Y_Q \rangle$, as $$\langle Y_Q \rangle = p_1 Q = \frac{Q}{2}\text{erfc}\left(-\frac{v_f}{\sqrt{2}\,\sigma_T}\right). \quad \text{(Eq. 4)}$$

When the comparator 204 performs comparison by Q times consecutively, and if y is denoted as the number of times the comparison results indicating $V_+ > V_-$ are actually observed, Eq. 4 shows that the observed comparison results $y_Q$ will be a good estimation of the expected value $\langle Y_Q \rangle$. The accuracy of estimating the expected value $\langle Y_Q \rangle$ by using the comparison results $y_Q$ will become higher and higher as the number of comparisons Q is increased. In other words, once the comparison results $y_Q$ are obtained from a sequence of Q comparisons, we may use the comparison results $y_Q$ as a good estimate of the expected value $\langle Y_Q \rangle$. Since the probability $p_1$ and the voltage $V_f$ have a one-to-one correspondence, it can be inferred that the expected value $\langle Y_Q \rangle$ and the voltage $V_f$ also have a one-to-one correspondence according to Eq. 4. Therefore, a good estimate of the voltage $V_f$ may be obtained from the comparison results $y_Q$. This reasoning of obtaining an estimate of the voltage $V_f$ (i.e., the difference between the input analog signal $V_{in}$ and the corresponding threshold voltage) from an observed outcome of comparisons (i.e., the comparison results $y_Q$) forms the theoretical foundation for the embodiments in the present invention.

Figure 6:
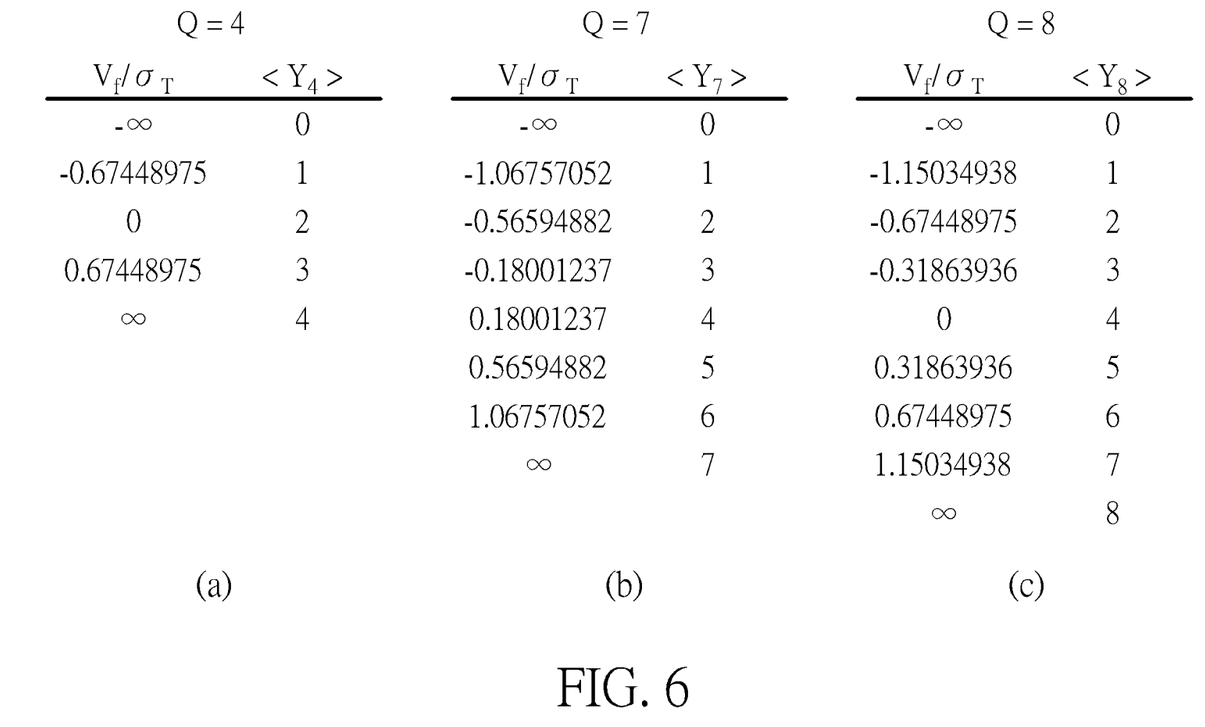
FIG. 6 shows several examples that list values of $V_i/\sigma_T$ at which the expected value of the comparison results is 0, 1 . . . , Q.

FIG. 6 shows several examples that list values of $V_f/\sigma_T$ at which the expected value $\langle Y_Q \rangle$ is 0, 1 . . . , Q in the implementations where the number of times Q of comparisons is 4, 7 and 8. The expected value $\langle Y_Q \rangle$ may have 5 possible outcomes 0, 1, 2, 3 and 4 when Q equals 4. Similarly, the expected value $\langle Y_Q \rangle$ may have 8 possible outcomes when Q equals 7, and have 9 possible outcomes when Q equals 8. In this embodiment, the values $V_f/\sigma_T$ are calculated based on the assumption that the noise T is a normal (Gaussian) random process. If there are more comparison results indicating $V_+>V_-$ and generating the output value 1, the value $V_f/\sigma_T$ may be larger, which means that the input analog signal $V_{in}$ may probably have a larger voltage farther greater than the threshold voltage $V_{th}(C, C+1)$. In contrary, if there are fewer comparison results indicating $V_+>V_-$, or more comparison results indicating $V_+\leq V_-$, the value $V_f/\sigma_T$ may be smaller or even a negative value, which means that the input analog signal $V_{in}$ may probably be closer to or even lower than the threshold voltage $V_{th}(C, C+1)$. Therefore, after Q comparisons are performed, the value $V_f/\sigma_T$ may be obtained according to the combination of Q comparison results $y_Q$, and the voltage $V_f$ may be calculated if the standard deviation $\sigma_T$ is a known value. The voltage $V_f$ may further be used to calculate the input analog signal $V_{in}$, so as to achieve a better approximation and estimation of the analog signal $V_{in}$.

In the SAR ADC 20, the value $V_f/\sigma_T$ may be applied to estimate the fractional parts, as the fractional bits $f_1$-$f_4$ to be stored in the register 210. In this regard, the results of the multiple comparisons for the LSB $b_0$ may be applied to increase the resolution of the SAR ADC 20; that is, the resolution of the SAR ADC 20 will have 4 more bits where the additional finer information is recorded in the 4 fractional bits $f_1$-$f_4$.

Figure 7:
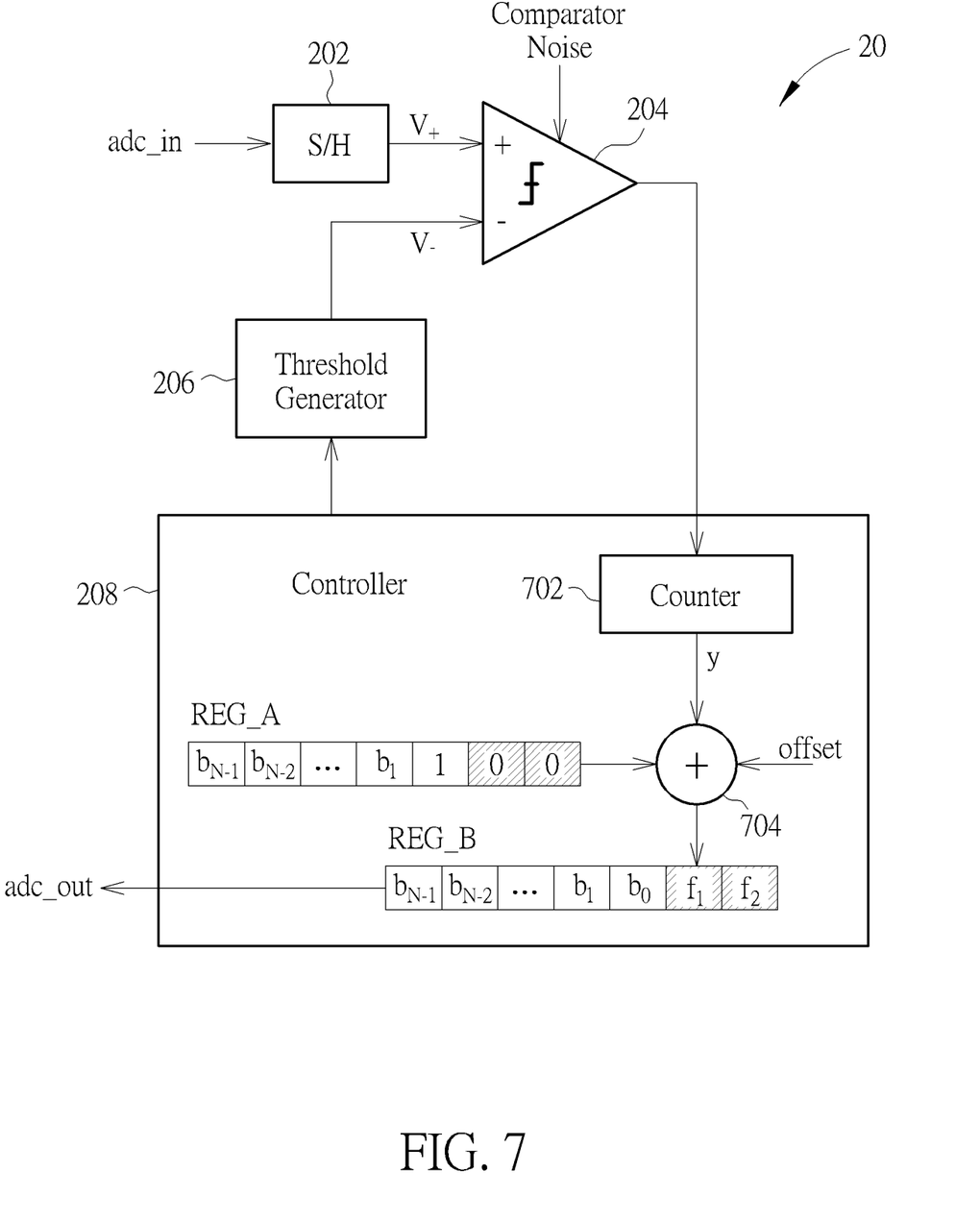
FIG. 7 is a schematic diagram of the SAR ADC with a detailed implementation of the controller according to an embodiment of the present invention.

FIG. 7 is a schematic diagram of the SAR ADC 20 with a detailed implementation of the controller 208 according to an embodiment of the present invention. As shown in FIG. 7, the controller 208 includes a counter 702, an adder 704, and two registers REG_A and REG_B. The counter 702 is configured to record the comparison results as the number of times when $V_+>V_-$. The register REG_A is used for storing the bit values for controlling the threshold generator 206 to generate appropriate threshold voltages, where the threshold voltages for comparison may be set according to the value of each of the most significant N bits $b_{N-1}$-$b_0$ stored in the register REG_A. The register REG_B is used for storing the output codeword adc_out.

During the comparator operation, the controller 208 is configured to control the comparator 204 to first perform one comparison for each of the N-1 bits from $b_{N-1}$ to $b_1$ as in a general SAR ADC. After the values of the bits $b_{N-1}$-$b_1$ are derived, the controller 208 may next set the bit $b_0$ in the register REG_A to 1 and generate a threshold voltage according to the bit pattern $[b_{N-1}, \ldots, b_1, 1]$ stored in the register REG_A. While the threshold voltage $V_{th}$ is held at this level, the comparator 204 may perform a sequence of 8 comparisons, and the counter 702 records the number of the event $V_+>V_-$ among the 8 comparisons. At the end of these 8 comparisons, the cumulative result produced by the counter 702, labeled as y in FIG. 7, represents one observed outcome of the random process $Y_Q$ as defined in Eq. 3. When a statistical model of uniform distribution is adopted for the noise T, the average observed outcome $\overline{Y_Q}$ may be linearly related to the voltage $V_f$ and therefore the cumulative result y may be used as an estimate of the voltage $V_f$. Accordingly, in the last step of this conversion, the controller 208 may add the value of the cumulative result y and the values stored in the register REG_A which is $[b_{N-1}, \ldots, b_1, 1]$ at this instant (through the adder 704), and properly adjust the sum with an offset and then save the calculation result in the register REG_B. Once the result becomes stable, the output codeword adc_out of the SAR ADC 20 is available at the register REG_B.

As shown in FIG. 7, the cumulative result y with the appropriate offset may be used to determine the values of several LSBs of the output codeword adc_out, including $b_0$, $f_1$ and $f_2$, where $f_1$ and $f_2$ may be regarded as the fractional bits for improving the resolution of the SAR ADC 20. For example, the bit values of $[b_0, f_1, f_2]$ may be [0, 0, 0] if the cumulative result y indicates that none of the 8 comparisons has the result $V_+>V_-$, may be [0, 0, 1] if the cumulative result y indicates that only one of the 8 comparisons has the result $V_+>V_-$, and may be [1, 1, 1] if the cumulative result y indicates that all of the 8 comparisons have the result $V_+>V_-$.

Note that the offset may be optionally included or omitted, and may have different values in different implementations. If the offset is not required, the cumulative result y may be summed up with the bit values stored in the register REG_A to generate the output codeword adc_out to be stored in the register REG_B. Alternatively, in the embodiment with an offset as shown in FIG. 7, one choice for the amount of offset is to set the offset to be equal to $-\frac{3}{4}Q$. In the case of 8 comparisons, Q is equal to 8 and the offset may be set to $-6$. It is an obvious extension for the comparator 204 to perform multiple comparisons other than 8 times. For example, the SAR ADC 20 may be configured to perform 16 comparisons in the step for estimating the voltage $V_f$ and LSBs, allocate 3 fractional bits in both registers REG_A and REG_B, and apply an offset of $-12$ to generate an N+3-bit output codeword adc_out.

In the above embodiment, the cumulative result y is directly added to the bit values $b_0$, $f_1$ and $f_2$ to generate the output codeword adc_out, where the noise T may be assumed to have a uniform distribution. In another embodiment, the noise T may follow another distribution such as Gaussian distribution as illustrated in FIG. 5, so that the cumulative result y may be converted into the bit values nonlinearly.

Figure 8:
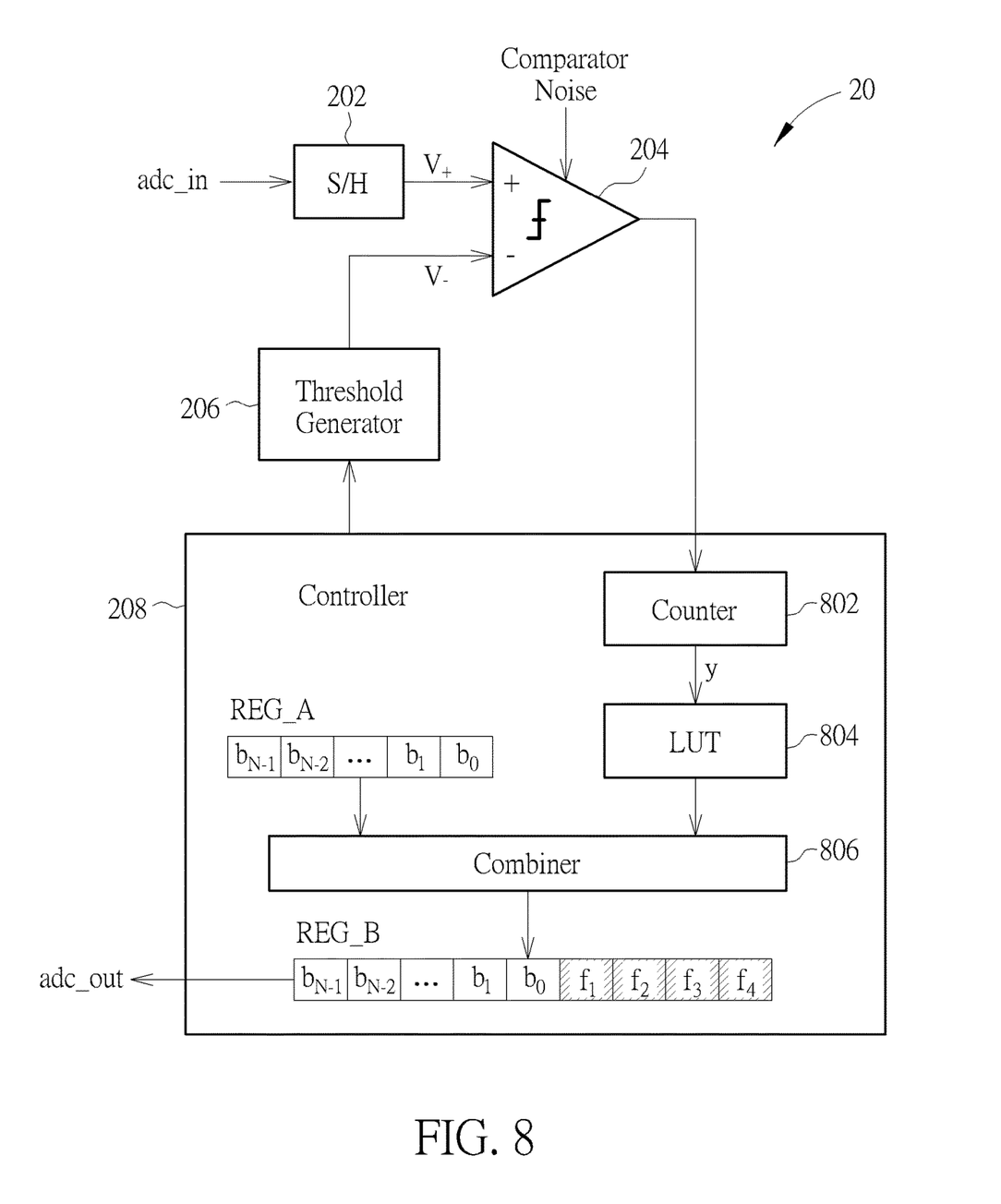
FIG. 8 is a schematic diagram of the SAR ADC with another detailed implementation of the controller according to an embodiment of the present invention.

FIG. 8 is a schematic diagram of the SAR ADC 20 with another detailed implementation of the controller 208 according to an embodiment of the present invention. As shown in FIG. 8, the controller 208 includes a counter 802, a lookup table (LUT) 804, a combiner 806, and two registers REG_A and REG_B. Similarly, the counter 802 is configured to record the comparison results indicating the number of times when $V_+>V_-$. The register REG_A is used for storing the bit values for controlling the threshold generator 206 to generate appropriate threshold voltages, and the register REG_B is used for storing the output codeword adc_out. In addition, the LUT 804 may include a plurality of entries for storing the bit values of several LSBs that are used to estimate the voltage $V_f$. In the embodiment as shown in FIG. 8, the LUT 804 may include entries consisting of the values of the LSB $b_0$ and 4 fractional bits $f_1$-$f_4$, and the controller 208 may apply the output result of the counter 802 to index the LUT 804 and use the LUT 804 output to fill the bit values of $b_0$ and $f_1$-$f_4$ in the register REG_B, in order to form the output codeword adc_out.

In this embodiment, the counter 802 may record the cumulative result y of comparisons, and the LUT 804 is employed to derive the fractional bits of the output codeword adc_out based on the cumulative result y. This embodiment is effective no matter whether the statistical characteristics of the noise T follow the uniform distribution, Gaussian distribution, or any other possible distribution. Revisit the table in FIG. 6(b) which lists the values of $V_f/\sigma_T$ corresponding to the expected outcome of comparisons in the case of a zero-mean normally distributed noise $N(0, \sigma_T)$, also known as Gaussian noise. It can be seen from the table that the relationship between $V_f$ and $<Y_Q>$ deviates from being linear. This fact leads to employment of the LUT 804 to map the observed outcome obtained from the counter 802 into estimates of fractional bits $f_1$-$f_4$.

For example, the controller 208 may include a memory which is configured to store the LUT 804. When obtaining the cumulative result y from the counter 802, the controller 208 may get a table index according to the cumulative result y. By looking up the LUT 804 according to the table index, the controller 208 may obtain the values of several LSBs of the output codeword adc_out, including the original LSB $b_0$ and fractional bits $f_1$-$f_4$, which are further combined with other bit values stored in the register REG_A (through the combiner 806), to generate the output codeword adc_out to be stored in the register REG_B.

Figure 9:
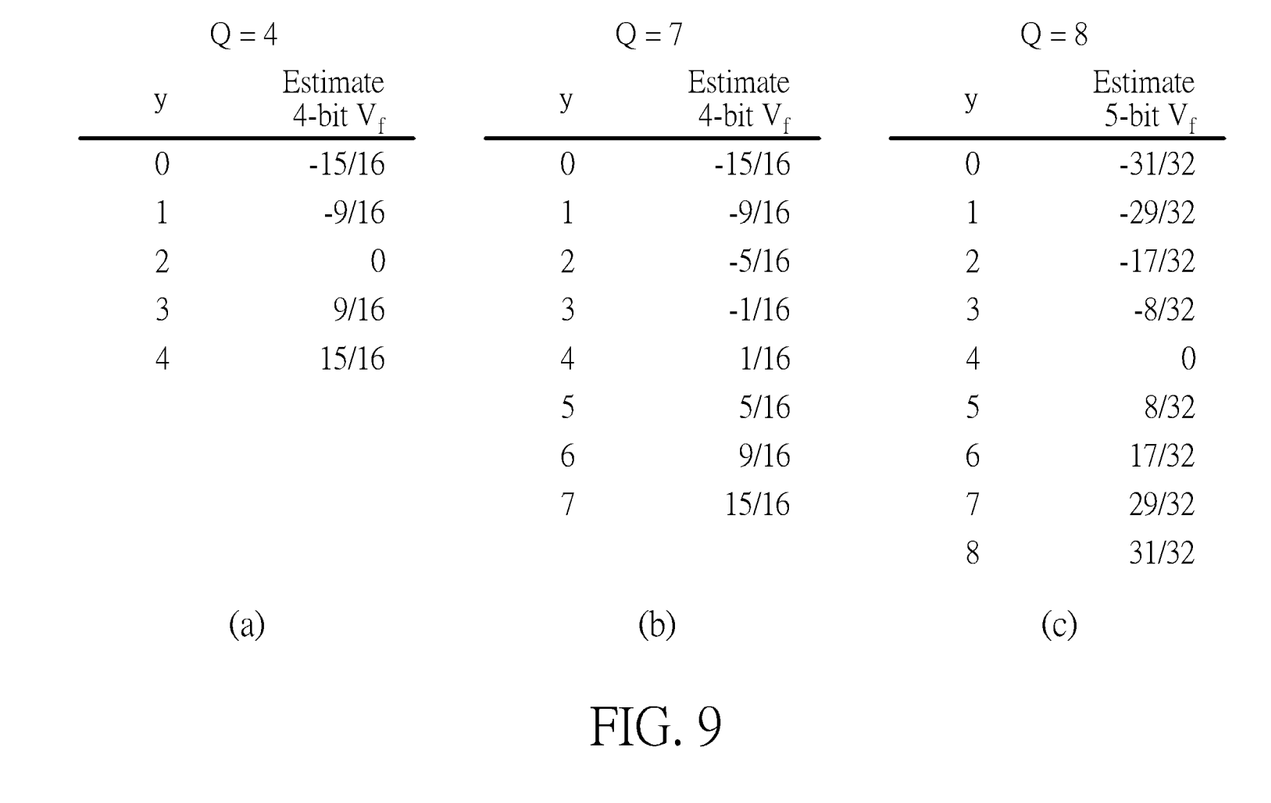
FIG. 9 illustrates an exemplary content of the LUT for estimating the voltage.

FIG. 9 illustrates an exemplary content of the LUT 804 for estimating the voltage $V_f$. In a case where the comparator 204 is characterized to have a zero-mean Gaussian noise with a standard deviation $\sigma_T$=0.5 LSB, if the SAR ADC 20 is configured with 4 fractional bits $f_1$-$f_4$ and 7 comparisons are performed to find the fractional bits $f_1$-$f_4$ as shown in FIG. 8, then based on the table contents in FIG. 6(b), the LUT 804 may be configured with the entries shown in FIG. 9(b). As an example, in a conversion when the step of 7 comparisons produces an outcome that the cumulative result y is 3, the voltage $V_f$ is then estimated to have a value of $-1/16$, which is converted into bit values to be incorporated in the fractional bits $f_1$-$f_4$. As another example, if the counter 802 records that the cumulative result y is 6, then the voltage $V_f$ is estimated to be $5/16$. It is noteworthy that the table entries given in FIG. 9(b) are limited to be within the range of $[-15/16, 15/16]$, to be adapted to the values of 4 fractional bits $f_1$-$f_4$. Depending on the characteristics of the noise and the number of fractional bits, the minimum and maximum of table entries may be chosen accordingly. FIG. 9(a) lists table entries of a different case where $\sigma_T$=0.5 LSB, 4-bit estimate for the voltage $V_f$, and 4 comparisons in the step of obtaining the LSBs. FIG. 9(c) lists table entries of yet another case where $\sigma_T$=0.8 LSB, 5-bit estimate for the voltage $V_f$, and 8 comparisons in the step of obtaining the LSBs.

Therefore, if Q comparisons are performed under the same threshold voltage, there may be Q+1 possible outcomes of the cumulative result y (from 0 to Q), and the LUT 804 may store the values for estimating the voltage $V_f$ corresponding to these Q+1 outcomes. Note that the values of the table entries shown in FIG. 9 are set based on the assumption that the noise T has a Gaussian distribution with a predetermined standard deviation $\sigma_T$, but the table content should not be limited to those provided in this disclosure. In another embodiment, if the noise T follows another type of distribution and/or the standard deviation $\sigma_T$ is different, the content of the LUT 804 may be modified accordingly.

In an embodiment, the controller 208 may further include a multi-pass design. When the aforementioned comparisons for generating the LSBs are regarded as the first-pass processing, the controller 208 may be configured to add additional passes each of which consists of another set of multiple comparisons. The multi-pass scheme will use the results of the previous pass to decide the threshold voltage $V_{th}$ for comparisons in the following pass and control the threshold generator 206 to generate a proper threshold voltage $V_{th}$ accordingly. The threshold voltage $V_{th}$ employed in the following pass may be the same or different from that employed in the previous pass.

Figure 10:
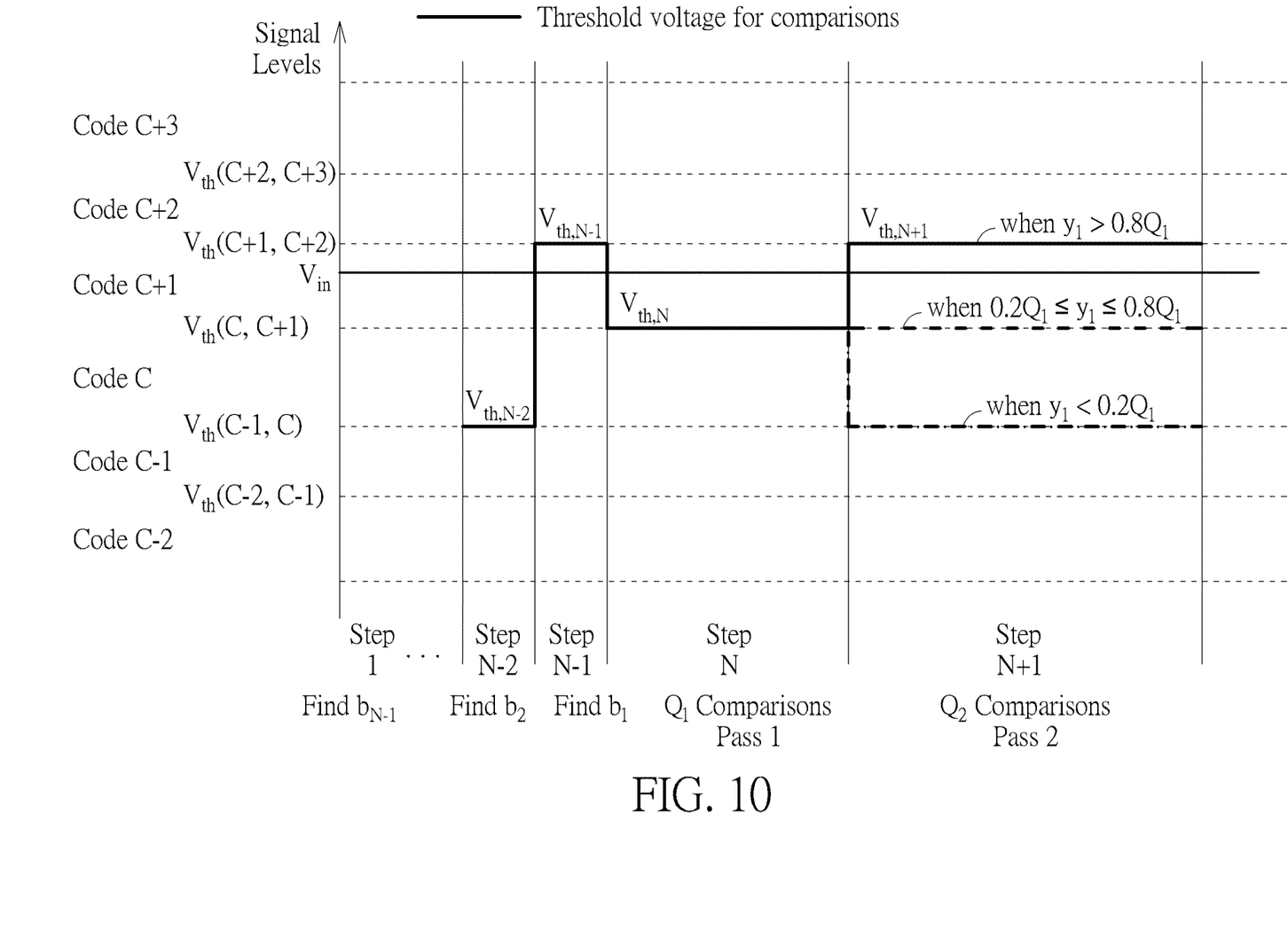
FIG. 10 is a waveform diagram of the threshold voltage in the multi-pass operations.

FIG. 10 is a waveform diagram of the threshold voltage $V_{th}$ in the multi-pass operations, where the sampled and held input analog signal $V_{in}$ is also shown for easy reference. In addition to $Q_1$ comparisons in Pass 1 to estimate the voltage $V_f$, the controller 208 may add a second pass of $Q_2$ comparisons to improve the accuracy of estimate for $V_f$. Based on the outcome of comparisons in Pass 1, the controller 208 may decide and set an optimal threshold level for the comparisons in Pass 2.

In an embodiment, the SAR ADC 20 is configured to convert the analog signal $V_{in}$ into an N+M− bit digital code, with appropriate threshold voltages set in a series of comparisons. During the conversion operations, the SAR ADC 20 starts in Step 1 to find the MSB $b_{N-1}$, and the conversion process continues toward Step N−1, to find the values of the bits $b_{N-1}$-$b_1$. After the values of the bits $b_{N-1}$-$b_1$ are found, in Step N, the controller 208 performs a sequence of $Q_1$ comparisons of Pass 1 with the threshold voltage $V_{th,N}$ and stores the outcome in a first counter. According to the outcome in Pass 1, the controller 208 may instruct the threshold generator 206 to generate a threshold voltage $V_{th,N+1}$ to be used for the $Q_2$ comparisons in Pass 2. When the threshold voltage for Step N is $V_{th,N}=V_{th}(C, C+1)$, if the cumulative result generated from $Q_1$ comparisons is denoted by $y_1$, one exemplary criterion for the controller 208 to decide the threshold voltage $V_{th,N+1}$ is $$V_{th,N+1} = \begin{cases} V_{th}(C-1, C) & \text{when } y_1 < 0.2\, Q_1 \\ V_{th}(C, C+1) & \text{when } 0.2\, Q_1 \le y_1 \le 0.8\, Q_1 \\ V_{th}(C+1, C+2) & \text{when } 0.8\, Q_1 < y_1 \end{cases} \quad \text{(Eq. 5)}$$

The implementations of the threshold voltage $V_{th,N+1}$ are shown in FIG. 10.

Once the threshold voltage $V_{th,N+1}$ to be used in Pass 2 is decided, the conversion process enters Step N+1 to make $Q_2$ comparisons. The cumulative result of $Q_2$ comparisons in Pass 2, denoted by $y_2$, is then stored in another counter.

Referring back to FIG. 3, the comparator 204 may perform a series of first comparisons with respective threshold values to generate the first comparison results for determining the values of the MSBs, and then perform a series of second comparisons with a specific threshold value to generate the second comparison results for determining the values of the LSBs including $b_0$ and $f_1$-$f_M$. In consideration of the multi-pass operations, the comparator 204 may further perform a series of third comparisons to generate a plurality of third comparison results, where the input analog signal $V_{in}$ is compared with a third threshold such as the threshold voltage $V_{th,N+1}$ determined according to the second comparison results. The controller 208 may thereby generate the LSBs of the output codeword adc_out according to the cumulative result of the third comparison results, or further according to the cumulative result of the second comparison results.

Figure 11:
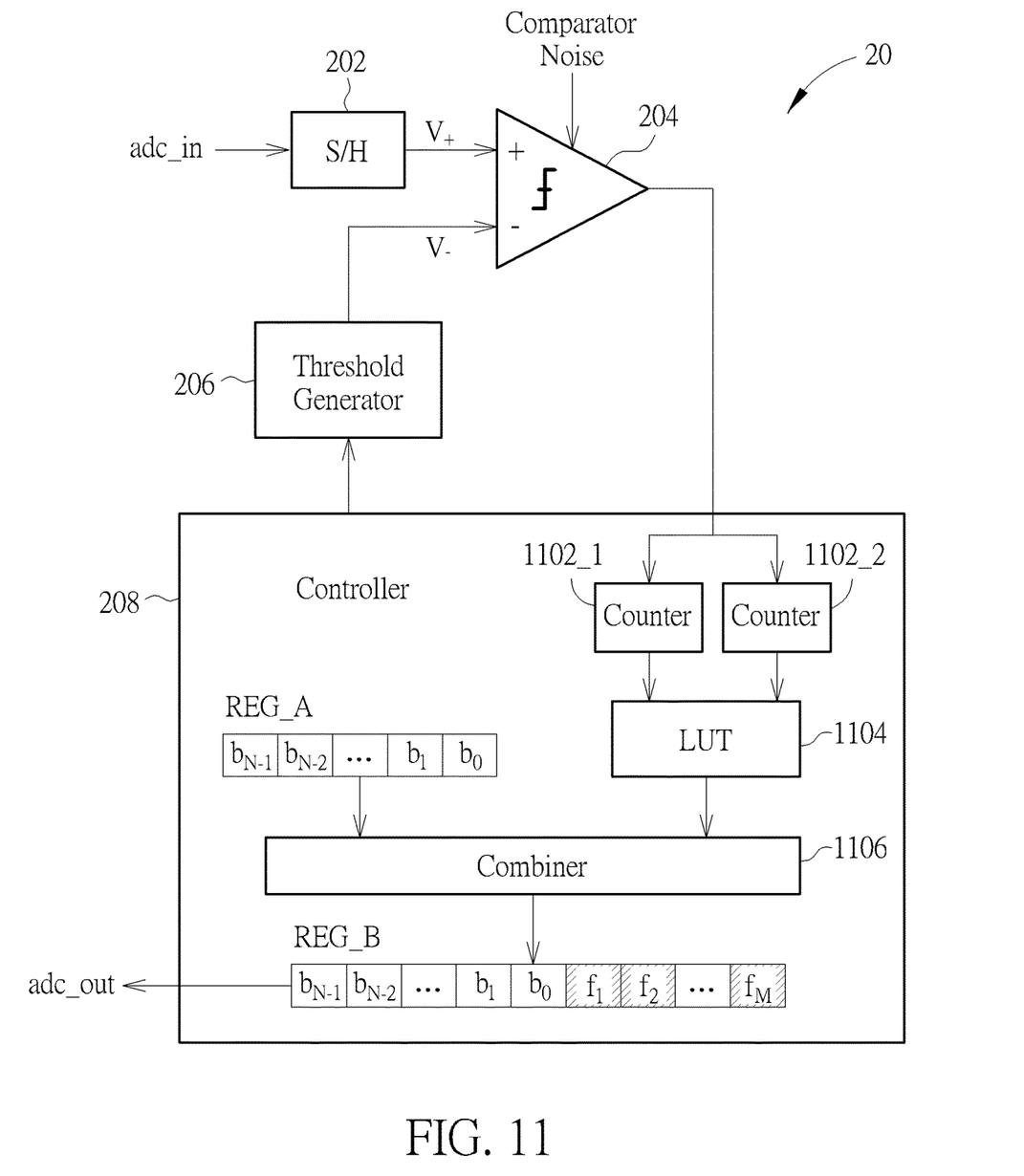
FIG. 11 is a schematic diagram of the SAR ADC with a further detailed implementation of the controller according to an embodiment of the present invention.

FIG. 11 is a schematic diagram of the SAR ADC 20 with a further detailed implementation of the controller 208 according to an embodiment of the present invention, where the SAR ADC 20 is configured to generate an N+M−bit output codeword adc_out, which includes N integer bits $b_{N-1}$-$b_0$ and M fractional bits $f_1$-$f_M$. As shown in FIG. 11, the controller 208 may include two counters 1102_1 and 1102_2, an LUT 1104, a combiner 1106, and two registers REG_A and REG_B. The counter 1102_1 is configured to record the comparison results of the $Q_1$ comparisons in Pass 1 to generate the cumulative result $y_1$, and the counter 1102_2 is configured to record the comparison results of the $Q_2$ comparisons in Pass 2 to generate the cumulative result $y_2$. The operations of other circuit blocks are similar to those illustrated in the above paragraphs, and will not be repeated herein.

At the end of Pass-2 comparisons, the combiner 1106 may realize the operations to derive the N+M−bit output codeword adc_out from the values stored in the register REG_A and the values of the cumulative results $y_1$ and $y_2$. In an embodiment, when $V_{th,N+1} \neq V_{th,N}$, the combiner 1106 may use the cumulative result $y_2$ to generate the table index to access the corresponding $Q_2$ entries in the LUT 1104, to obtain an estimate of the voltage $V_f$, and then combine said estimate of the voltage $V_f$ (as LSBs) and the values in the register REG_A (as MSBs) to derive the output codeword adc_out. An offset is optionally employed in the derivation of the output codeword adc_out as mentioned in a previous embodiment.

In another embodiment, when $V_{th,N+1} = V_{th,N}$, the combiner 1106 may calculate the summation of the cumulative results as $y = y_1 + y_2$ and use the summation result y to index the corresponding $Q_1 + Q_2$ entries in the LUT 1104 to obtain an estimate of the voltage $V_f$, and then combine the values in the register REG_A (as MSBs), said estimate of the voltage $V_f$ (as LSBs) and optionally said offset into the output codeword adc_out.

In the embodiment as shown in FIG. 11, the controller 208 includes two counters 1102_1 and 1102_2 for producing the cumulative results $y_1$ and $y_2$ for Pass-1 and Pass-2 comparisons, respectively. Note that the multi-pass operations of the SAR ADC 20 may include three or more passes with the same or different threshold voltages, and thus there may be more than 2 counters included in the controller 208 for recording the corresponding cumulative results.

Also note that the above criterion for determining the threshold voltage $V_{th,N+1}$ according to the cumulative result $y_1$ as specified in Eq. 5 is merely an example, where the threshold levels $0.2Q_1$ and/or $0.8Q_1$ may be modified. Another exemplary rule to determine the threshold voltage $V_{th,N+1}$ in Pass 2 is given as follows:

$$V_{th,N+1} = \begin{cases} V_{th}(C-1, C) & \text{when } y_1 < 0.1 Q_1 \\ [V_{th}(C-1, C) + V_{th}(C, C+1)]/2 & \text{when } 0.1 Q_1 \leq y_1 < 0.3 Q_1 \\ V_{th}(C, C+1) & \text{when } 0.3 Q_1 \leq y_1 \leq 0.7 Q_1 \\ [V_{th}(C, C+1) + V_{th}(C+1, C+2)]/2 & \text{when } 0.7 Q_1 < y_1 \leq 0.9 Q_1 \\ V_{th}(C+1, C+2) & \text{when } 0.9 Q_1 < y_1 \end{cases}$$

where the resolution of the threshold voltage $V_{th,N+1}$ is doubled to improve the accuracy of the estimate of the voltage $V_f$. In general, the threshold voltage $V_{th,N+1}$ tends to be larger if the cumulative result $y_1$ is closer to the number of comparisons $Q_1$, which means that most of the comparison results indicate $V_+ > V_-$ and a larger threshold is preferred; the threshold voltage $V_{th,N+1}$ tends to be smaller if the cumulative result $y_1$ is closer to 0, which means that most of the comparison results indicate $V_+ \leq V_-$ and a smaller threshold is preferred.

Alternatively, the rules to decide the threshold voltage $V_{th,N+1}$ used in Pass 2 may be implement by using an LUT indexed by the cumulative result $y_1$. The entries in this LUT may be programmed according to the statistical nature of the noise and the number of comparisons in Pass 1.

Simulations are performed for various combinations of parameters, including an analog front-end (AFE) noise, comparator noise, number of comparisons in Pass 1 and number of comparisons in Pass 2, employed in embodiments of the present invention. The results are listed in Table 1 and Table 2, as shown below:

TABLE 1

| AFE noise ($LSB_{ADC}$) | 0 | 0 | 0 | 0.5 | 0.5 | 0.5 |
|---|---|---|---|---|---|---|
| Comparator noise ($LSB_{ADC}$) | 0.8 | 0.8 | 0.8 | 0.8 | 0.8 | 0.8 |
| SQNR of conventional SAR ADC (dB) | 76.3 | 76.3 | 76.3 | 75.1 | 75.1 | 75.1 |
| Number of Pass-1 comparisons | 4 | 6 | 8 | 4 | 6 | 8 |
| SQNR (1-Pass, by Majority) (dB) | 77.6 | 77.8 | 77.9 | 76.0 | 76.2 | 76.3 |
| SQNR (1-Pass, by 4-bit LUT) (dB) | 79.1 | 79.8 | 80.1 | 77.1 | 77.5 | 77.7 |
| Multi-pass, Number of Pass-2 comparisons | 4 | 6 | 6 | 4 | 6 | 6 |
| SQNR (2-Pass, by 4-bit LUT) (dB) | 81.2 | 82.2 | 82.3 | 78.3 | 78.7 | 78.8 |

TABLE 2

| AFE noise ($LSB_{ADC}$) | 0 | 0 | 0 | 0.5 | 0.5 | 0.5 |
|---|---|---|---|---|---|---|
| Comparator noise ($LSB_{ADC}$) | 0.8 | 0.8 | 0.8 | 0.8 | 0.8 | 0.8 |
| SQNR of conventional SAR ADC (dB) | 76.3 | 76.3 | 76.3 | 75.1 | 75.1 | 75.1 |
| Number of Pass-1 comparisons | 4 | 6 | 8 | 4 | 6 | 8 |
| SQNR (1-Pass, by Majority) (dB) | 77.5 | 77.7 | 77.8 | 76.0 | 76.1 | 76.2 |
| SQNR (1-Pass, by 4-bit LUT) (dB) | 79.1 | 79.7 | 80.0 | 77.1 | 77.5 | 77.7 |
| Multi-pass, Number of Pass-2 comparisons | 4 | 6 | 6 | 4 | 6 | 6 |
| SQNR (2-Pass, by 4-bit LUT) (dB) | 81.1 | 82.0 | 82.1 | 78.2 | 78.6 | 78.6 |

In these embodiments, the SAR ADC may convert a full-scale sinusoid input signal into a digital output codeword that includes 14 integer bits (i.e., $b_{13}$-$b_0$) and 4 fractional bits (i.e., $f_1$-$f_4$), where the sample rate is 768 kilo-samples per second (ksps). The comparator noise is the noise T as described in the above paragraphs, and the AFE noise is a noise generated in the AFE circuit and employed in the input analog signal before the input analog signal enters the SAR ADC. The AFE noise and the comparator noise are represented in a unit of a minimum bit level of the SAR ADC (i.e., $LSB_{ADC}$). Table 1 shows the simulation results where a 1-kHz single-tone input signal is applied, and Table 2 shows the simulation results where a 300-kHz single-tone input signal is applied.

In Table 1 and Table 2, Row 3, labeled "SQNR of conventional SAR ADC", shows the signal to quantization noise ratios of a conventional SAR ADC without multiple comparisons for the LSB ($b_0$). Row 5, labeled "SQNR (1-pass, by Majority)", lists the results of a variation of conventional SAR ADC performing multiple comparisons in one pass and applying the majority-rule to derive the LSB ($b_0$). Results corresponding to the embodiments of this invention are given in Rows 6 and 8 of the tables. Row 6, labeled "SQNR (1-pass, by 4-bit LUT)", lists the simulation results over an embodiment configured with single pass of comparisons and an LUT for evaluating estimates of the voltage $V_f$. Row 8, labeled "SQNR (2-pass, by 4-bit LUT)", lists the simulation results over an embodiment configured with 2 passes of comparisons and an LUT for evaluating estimates of the voltage $V_f$.

Table 1 and Table 2 clearly demonstrate the improvement of SQNR provided by the embodiments of the present invention. For example, as shown in Table 1, when the AFE noise is ignored and the comparator noise equals 0.8 LSB, the data in Column 3 show that a 1-pass and 6-comparison SAR ADC outperforms the conventional SAR ADC by an improvement on SQNR of about 3.5 dB, while a 2-pass, 6-comparison in Pass 1 and 6-comparison in Pass 2 SAR ADC outperforms the conventional SAR ADC by about 5.9 dB which is equivalent to an increase of almost 1 bit of ENOB (Effective Number of Bits). When the AFE noise is assumed to have a value of 0.5 LSB, improvements achieved in the SAR ADC are slightly lower due to the non-zero AFE noise. For example, according to the data in Column 6, a 1-pass and 6-comparison SAR ADC achieves a 2.4 dB improvement, while a 2-pass, 6-comparison in Pass 1 and 6-comparison in Pass 2 SAR ADC achieves a 3.6 dB improvement, equivalent to an increase of about 0.6 bit of ENOB over the conventional SAR ADC. Table 2 shows the simulation results on a 300 kHz single-tone test signal, where the improvements on SQNR over the conventional SAR ADC are consistent with those in the case of 1 kHz single-tone test signal.

To sum up, the present invention provides a novel SAR ADC, which is capable of achieving SQNR improvements by generating fractional bits based on the statistical properties of the noise under multiple comparisons for the LSB, so as to increase the resolution of the SAR ADC. In an embodiment, the SAR ADC may apply a counter to record the cumulative result of the multiple comparisons, and add the value of the cumulative result as the LSBs, including the original LSB $b_0$ and fractional bits $f_1$-$f_M$, to generate the output codeword. In an embodiment, the controller of the SAR ADC may take the cumulative result of the multiple comparisons to index an LUT to find the bit values for estimating the voltage difference of the input analog signal and the threshold voltage, so as to generate the output codeword by referring to the LUT. In an embodiment, a multi-pass scheme is applied to use the results of comparisons in the previous pass to decide the threshold voltage for comparisons in the following pass and control the threshold generator to generate a proper threshold voltage accordingly, so as to find a more preferable threshold voltage for comparisons. The implementations and operations provided in embodiments of the present invention may improve the SQNR of the SAR ADC, thereby improving the overall performance of the control system using the SAR ADC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A successive approximation register (SAR) analog-to-digital converter (ADC) comprising:
a comparator, a threshold generator and a controller;
wherein the comparator receives an analog signal and the SAR ADC outputs an output codeword;
wherein the comparator performs a plurality of first comparisons and a plurality of second comparisons;
wherein the controller determines a plurality of most significant bits of the output codeword according to a plurality of first comparison results corresponding to the plurality of first comparisons;
wherein the plurality of first comparisons are performed by comparing the analog signal with a plurality of first thresholds;
wherein the controller determines a plurality of least significant bits of the output codeword according to a plurality of second comparison results corresponding to the plurality of second comparisons;
wherein the plurality of second comparisons are performed by comparing the analog signal with a second threshold;
wherein the controller controls the threshold generator to produce the plurality of first thresholds and the second threshold according to the plurality of first comparison results.

2. The SAR ADC of claim 1, wherein the controller obtains a cumulative result of the plurality of second comparison results and determines the plurality of least significant bits of the output codeword according to the cumulative result.

3. The SAR ADC of claim 2, wherein the controller comprises a counter, configured to produce the cumulative result.

4. The SAR ADC of claim 2, wherein the controller determines the plurality of least significant bits of the output codeword according to the cumulative result and an offset.

5. The SAR ADC of claim 2,
wherein the controller comprises a memory configured to store a lookup table;
wherein the controller obtains a table index according to the cumulative result;
wherein the controller obtains the plurality of least significant bits of the output codeword by looking up the lookup table according to the table index.

6. The SAR ADC of claim 1,
wherein the comparator further performs a plurality of third comparisons;
wherein the controller determines the plurality of least significant bits of the output codeword according to a plurality of third comparison results corresponding to the plurality of third comparisons;
wherein the plurality of third comparisons are performed by comparing the analog signal with a third threshold;
wherein the controller controls the threshold generator to produce the third threshold.

7. The SAR ADC of claim 6,
wherein the controller determines the third threshold according to the plurality of second comparison results.

8. The SAR ADC of claim 6,
wherein the controller obtains a first cumulative result of the plurality of second comparison results and a second cumulative result of the plurality of third comparison results;
wherein the controller determines the plurality of least significant bits of the output codeword according to the second cumulative result.

9. The SAR ADC of claim 8,
wherein the controller comprises a memory configured to store a lookup table;
wherein the controller obtains a table index according to the second cumulative result;
wherein the controller obtains the plurality of least significant bits of the output codeword by looking up the lookup table according to the table index.

10. The SAR ADC of claim 8,
wherein the controller comprises a memory configured to store a lookup table;
wherein the controller obtains a table index according to the first cumulative result and the second cumulative result;
wherein the controller obtains the plurality of least significant bits of the output codeword by looking up the lookup table according to the table index.

11. The SAR ADC of claim 8, wherein the controller comprises a first counter and a second counter, configured to produce the first cumulative result and the second cumulative result.

12. A method applied in a successive approximation register (SAR) analog-to-digital converter (ADC) configured to output an output codeword, the method comprising:
receiving an analog signal;
performing a plurality of first comparisons on the analog signal with a plurality of first thresholds;
determining a plurality of most significant bits of the output codeword according to a plurality of first comparison results corresponding to the plurality of first comparisons;
performing a plurality of second comparisons on the analog signal with a second threshold;
determining a plurality of least significant bits of the output codeword according to a plurality of second comparison results corresponding to the plurality of second comparisons; and
determining the plurality of first thresholds and the second threshold according to the plurality of first comparison results.

13. The method of claim 12, wherein the step of determining the plurality of least significant bits according to the plurality of second comparison results comprises:
obtaining a cumulative result of the plurality of second comparison results; and
determining the plurality of least significant bits of the output codeword according to the cumulative result.

14. The method of claim 13, wherein the step of determining the plurality of least significant bits according to the cumulative result comprises:
determining the plurality of least significant bits of the output codeword according to the cumulative result and an offset.

15. The method of claim 13, wherein the SAR ADC comprises a memory configured to store a lookup table, and the step of determining the plurality of least significant bits according to the cumulative result comprises:
obtaining a table index according to the cumulative result; and
obtaining the plurality of least significant bits of the output codeword by looking up the lookup table according to the table index.

16. The method of claim 12, further comprising:
performing a plurality of third comparisons on the analog signal with a third threshold; and
determining the plurality of least significant bits of the output codeword according to a plurality of third comparison results corresponding to the plurality of third comparisons.

17. The method of claim 16, comprising:
determining the third threshold according to the plurality of second comparison results.

18. The method of claim 16, wherein the step of determining the plurality of least significant bits comprises:
obtaining a first cumulative result of the plurality of second comparison results and a second cumulative result of the plurality of third comparison results; and
determining the plurality of least significant bits of the output codeword according to the second cumulative result.

19. The method of claim 18, wherein the SAR ADC comprises a memory configured to store a lookup table, and the step of determining the plurality of least significant bits according to the second cumulative result comprises:
obtaining a table index according to the second cumulative result; and
obtaining the plurality of least significant bits of the output codeword by looking up the lookup table according to the table index.

20. The method of claim 18, wherein the SAR ADC comprises a memory configured to store a lookup table, and the step of determining the plurality of least significant bits comprises:
obtaining a table index according to the first cumulative result and the second cumulative result; and
obtaining the plurality of least significant bits of the output codeword by looking up the lookup table according to the table index.

* * * * *